United States Patent
Chen et al.

(10) Patent No.: US 9,167,725 B2
(45) Date of Patent: Oct. 20, 2015

(54) BACKPLANE STRUCTURE AND SERVER SYSTEM UTILIZING THE SAME

(71) Applicant: Super Micro Computer Inc., San Jose, CA (US)

(72) Inventors: Richard S. Chen, San Jose, CA (US); Lawrence H. Liang, San Jose, CA (US); Lawrence K. W. Lam, San Jose, CA (US); Shen Ping, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 175 days.

(21) Appl. No.: 14/140,508

(22) Filed: Dec. 25, 2013

(65) Prior Publication Data

US 2015/0181768 A1    Jun. 25, 2015

(51) Int. Cl.
  *H05K 7/20* (2006.01)
  *G06F 1/20* (2006.01)
  *H05K 7/14* (2006.01)

(52) U.S. Cl.
  CPC .............. *H05K 7/20718* (2013.01); *G06F 1/20* (2013.01); *H05K 7/1451* (2013.01); *H05K 7/20* (2013.01); *H05K 7/20581* (2013.01); *H05K 7/20727* (2013.01)

(58) Field of Classification Search
  CPC ....... H05K 7/20; H05K 7/1451; H05K 7/572; H05K 7/20563; H05K 7/20736; H05K 7/20727; H05K 7/20836; G06F 1/20; G06F 1/187; G06F 1/206
  USPC ............... 361/679.02, 679.46, 679.49, 679.5, 361/679.33, 679.36–679.39, 688, 690–695, 361/721, 736, 748, 752, 788; 165/80.2, 165/80.3, 104.33, 185, 121–126; 454/184; 174/15.1, 16.1, 520; 439/61, 718; 29/529

See application file for complete search history.

(56) References Cited

U.S. PATENT DOCUMENTS

| | | | |
|---|---|---|---|
| 6,325,636 B1 * | 12/2001 | Hipp et al. ....................... | 439/61 |
| 6,816,368 B2 * | 11/2004 | Yokosawa ................ | 361/679.33 |
| 6,950,895 B2 * | 9/2005 | Bottom ......................... | 710/301 |
| 7,139,170 B2 * | 11/2006 | Chikusa et al. .............. | 361/695 |
| 7,193,861 B2 * | 3/2007 | Uzuka et al. .................. | 361/786 |
| 7,362,566 B1 * | 4/2008 | Sivertsen ................. | 361/679.33 |
| 7,515,427 B2 * | 4/2009 | King et al. ..................... | 361/725 |
| 7,593,225 B2 * | 9/2009 | Sasagawa et al. ............. | 361/695 |
| 7,701,710 B2 * | 4/2010 | Tanaka et al. .............. | 361/679.5 |
| 7,722,359 B1 * | 5/2010 | Frangioso et al. .............. | 439/61 |
| 7,911,789 B2 * | 3/2011 | Sasagawa et al. ............. | 361/695 |
| 7,965,502 B2 * | 6/2011 | Miyamoto et al. ........ | 361/679.48 |

(Continued)

*Primary Examiner* — Michail V Datskovskiy (74) *Attorney, Agent, or Firm* — Chun-Ming Shih; HDLS IPR Services (57) ABSTRACT

A server system utilizing a backplane structure comprises first and second hard disk modules; a first backplane comprising a first wiring board comprising air vents and passive components and a second wiring board connected to a bottom portion of the first wiring board at a first angle and comprising first active components; and a second backplane comprising a third wiring board comprising second air vents and second passive components and a fourth wiring board connected to a bottom portion of the third wiring board at a second angle and comprising second active components thereon; wherein the first and second backplanes are disposed between the first and second hard disk modules; the first wiring board is directly corresponding to the first hard disk module; the third wiring board is directly corresponding to the second hard disk module; the first backplane is higher than the second backplane.

9 Claims, 6 Drawing Sheets

(56) References Cited

U.S. PATENT DOCUMENTS

| | | | |
|---|---|---|---|
| 7,988,063 B1* | 8/2011 | Dufresne et al. | 236/49.3 |
| 8,248,782 B2* | 8/2012 | Tanaka et al. | 361/679.5 |
| 8,800,884 B2* | 8/2014 | Dufresne et al. | 236/49.3 |
| 8,908,372 B1* | 12/2014 | West et al. | 361/695 |
| 2009/0135558 A1* | 5/2009 | Hughes | 361/679.46 |
| 2009/0294107 A1* | 12/2009 | Nishiyama et al. | 165/104.34 |

* cited by examiner

BACKPLANE STRUCTURE AND SERVER SYSTEM UTILIZING THE SAME

BACKGROUND OF THE INVENTION

1. Field of the Invention

The present invention is related to a backplane structure and a server system utilizing a backplane structure, in particular, to an improved backplane structure and a server utilizing a backplane structure having active components arranged separately from passive components.

2. Description of Related Art

With respect to our daily schedule of the present time, electronic products are widely used in nearly 90% of our daily needs. As we look closely at our living style today, almost all information and signal processing requires the use of electronic products, server systems and network systems to achieve the goal of such high volume transmissions. With the advancement of our technology and various professions, the complexity of server system is continuously increasing. For example, the transmission speed has been tremendously increased from thousands of bits per second in the past to today's several million bits per second. The technology of Cloud data transmission is also becoming more common. The hardware components, including the central processors and server systems, need to be developed more extensively in order to effectively achieve the processing and transmission of such electrical signals. As a result, the hardware development is an essential issue to be dealt with endlessly in the industry.

During the server system development process, heat dissipation has always been a key issue. As a matter of fact, the life cycle of a server system is not only based upon the speed, performance, price or quality, but also the heat dissipation capacity thereof. If the capacity of heat dissipation is poor, the computing performance and quality must be poor as well. As a result, the costs spent on the equipment and maintenance would be increased significantly.

Figure 1:
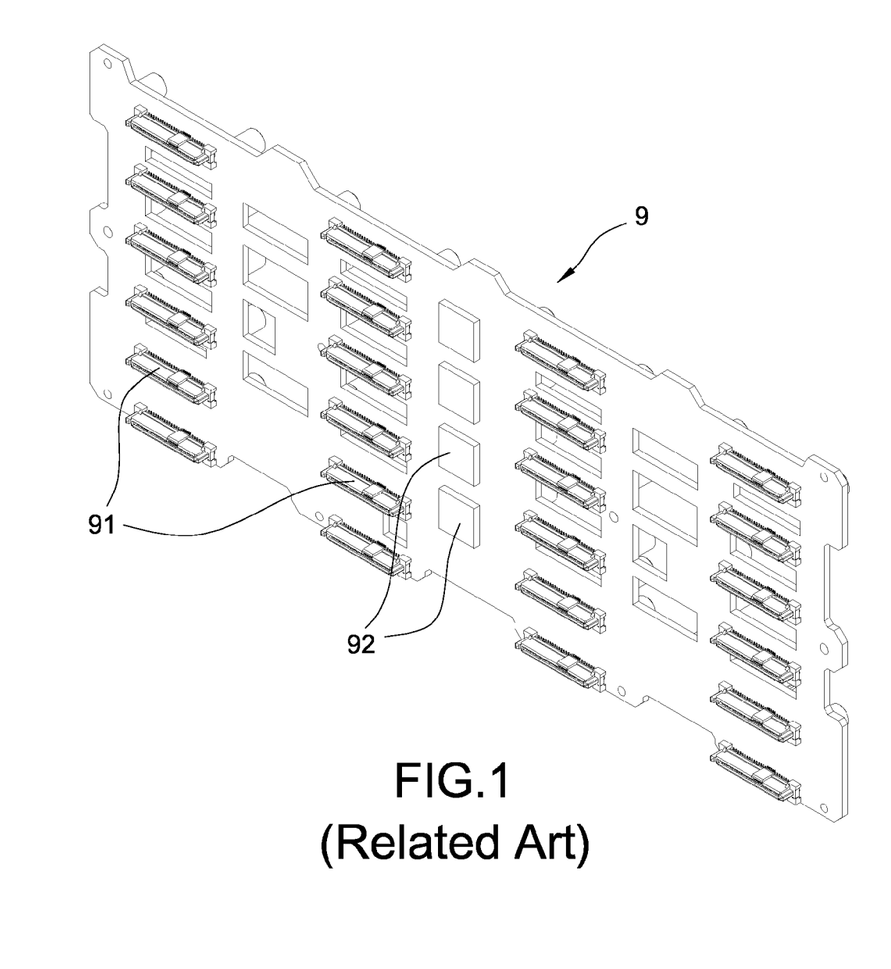
FIG. 1 is a perspective view of a backplane of a conventional server system.

Please refer to FIG. 1 showing a perspective view of a backplane of a conventional server system. In general, as shown in FIG. 1, the backplane 9 is formed by a single piece of printed circuit board (PCB) which are mounted by various types of electronic components. In specific, the backplane 9 comprises a plurality of passive components 91 and active components 92. As known in the person skilled in the art, the active components 92 upon the backplane 9 will generate high thermal heat and energy. Along with the passive components 91 with lower thermal heat, the backplane 9 inevitably cause massive heat dissipation issue during the operation. In other words, since the active components 92 with high thermal heat are placed together with the passive components 91 with lower thermal heat, the high thermal temperature of the active components 92 would definitely rise the temperature of the passive components 91 and cause them overheated. Furthermore, in the conventional server system, air vents are rarely provided on the backplanes for heat dissipation. Even if further fans or other auxiliary heat dissipation devices are additionally introduced, the volume and costs of server system would also be increased. Therefore, there is a need, for the person skilled in the art and for the industry, to develop and provide and an improved backplane structure to resolve the heat dissipation issues onto server systems.

With respect to the merits and spirits of the present invention, the following provides further detailed description along with the accompanied drawings thereof.

SUMMARY OF THE INVENTION

A primary objective of the present invention is to provide a backplane structure and a server utilizing the same in which a bottom portion of the a backplane is provided with another portion in order to allow active components capable of generating greater thermal energy to be provided thereon and to install passive components generating less thermal energy on the backplane such that the heat accumulation at the low heat sources can be significantly reduced and the efficiency of data transmission can be increased.

Another objective of the present invention is to provide a backplane structure and a server utilizing the same in which a plurality of air vents are provided at areas adjacent to the passive components of low heat sources at the backplane; in addition, the plurality of air vents are arranged in a matrix form such that the effects of air convection and heat dissipation thereof can be enhanced.

To achieve the aforementioned objectives, a backplane structure of the present invention comprises: a first wiring board having a first surface and a second surface and comprising a plurality of air vents and a plurality of passive components, wherein the first surface includes at least one connector; and a second wiring board connected to a bottom portion of the first wiring board through the connector and having a third surface and a fourth surface and comprising a plurality of active components; wherein the second surface is opposed to the third surface at a first angle.

A server system utilizing a backplane structure, comprising: a hard disk module; and a backplane comprising (1) a first wiring board, with a first surface and a second surface, comprising a plurality of air vents and a plurality of passive components, wherein the first surface includes at least one connector; and (2) a second wiring board, connected to a bottom portion of the first wiring board through the connector, having a third surface and a fourth surface, and comprising a plurality of active components, wherein the second surface is opposed to the third surface at a first angle; wherein the first surface of the first wiring board of the backplane is directly corresponding to the hard disk module.

A server system utilizing a backplane structure, comprising: a first hard disk module; a second hard disk module;

a first backplane, connecting to the first hard disk module, comprising (1) a first wiring board, with a first surface and a second surface, comprising a plurality of first air vents and a first plurality of passive components, wherein the first surface includes at least one first connector; and (2) a second wiring board, connected to a bottom portion of the first wiring board through the first connector, having a third surface and a fourth surface, and comprising a plurality of first active components, wherein the second surface is opposed to the third surface at a first angle;

a second backplane, connecting to the first hard disk module, comprising (1) a third wiring board, with a fifth surface and a sixth surface, comprising a plurality of second air vents and a second plurality of passive components, wherein the fifth surface having at least one second connector; and (2) a fourth wiring board, connected to a bottom portion of the third wiring board through the second connector, having a seventh surface and an eighth surface, and comprising a plurality of second active components, wherein the sixth surface is opposed to the seventh surface at a second angle; wherein the first backplane and the second backplane are disposed between the first hard disk module and the second hard disk module; the first surface of the first wiring board of the first backplane is directly corresponding to the first hard disk module; the fifth surface of the third wiring board of the second backplane is directly corresponding to the second hard disk module; a first height of the first backplane is higher than a second height of the second backplane.

In comparison to the known arts, the present invention includes at least the following merits:

1. By arranging all the heat sources such as the active components to gather at the second wiring board and the fourth wiring board at the bottom portions of the first backplane and the second backplane, the heat accumulation at low the heat source can be significantly reduced while the efficiency of the data transmission can be increased.

2. By arranging all the low heat source such as the passive components to gather at the first wiring board and the third wiring board at the vertical portions of the first backplane and the second backplane in addition to the plurality of air vents arranged in a matrix form thereon, the air convection for heat dissipation is increased, which in turn would certainly increase the effect of heat dissipation.

3. By inserting the second wiring board and the fourth wiring board at the bottom portions of the first wiring board and the third wiring board respectively, the effect air convection for heat dissipation at the upper part thereof would be greater.

DETAILED DESCRIPTION OF THE INVENTION

The following provides detailed description of embodiments of the present invention along with the accompanied drawings. It can, however, be understood that the accompanied drawings are provided for illustrative purposes only and shall not be treated as limitations to the present invention.

Figure 2:
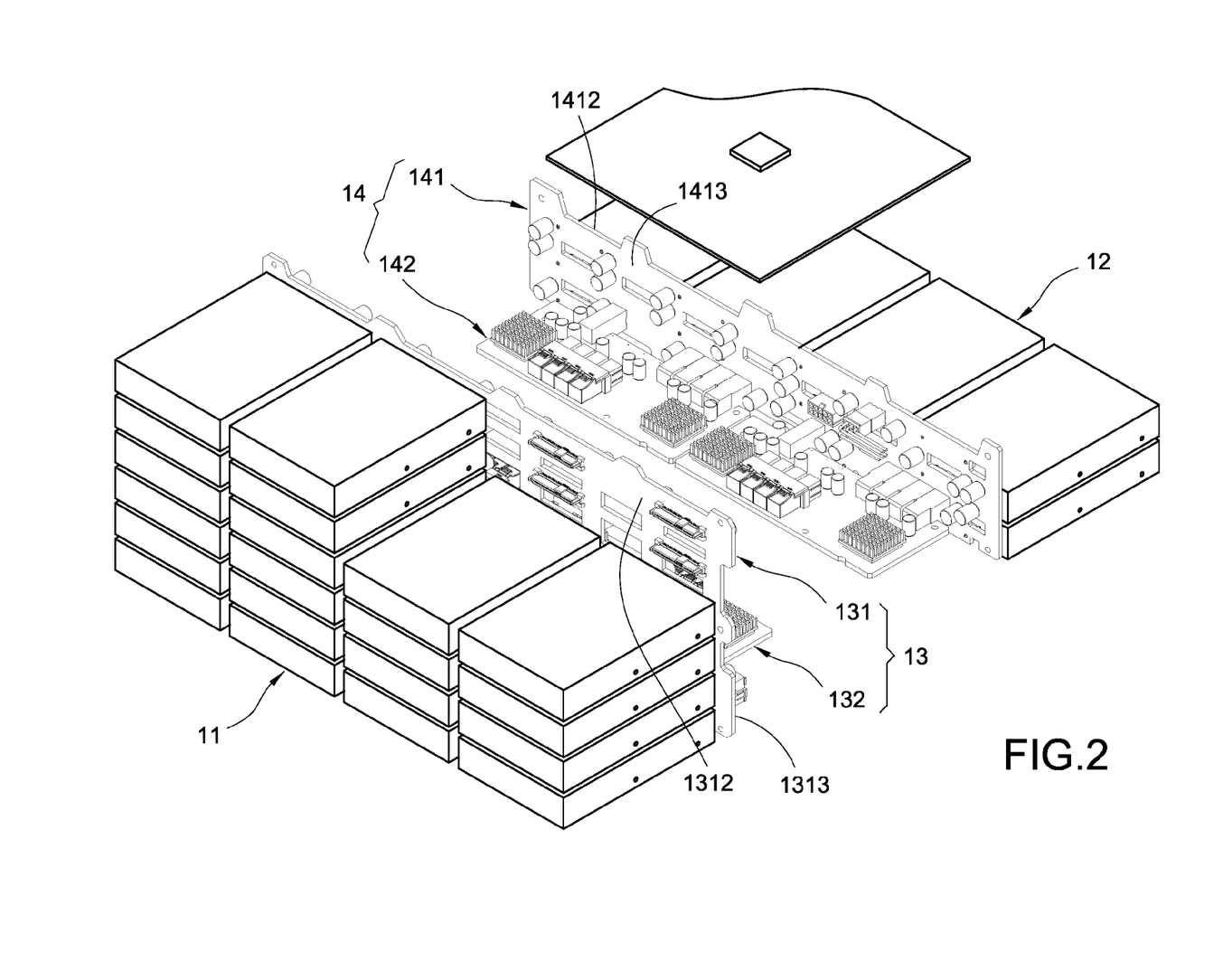
FIG. 2 is an exploded view of a preferred embodiment of an improved backplane structure and a server system utilizing a backplane structure of the present invention.
Figure 3:
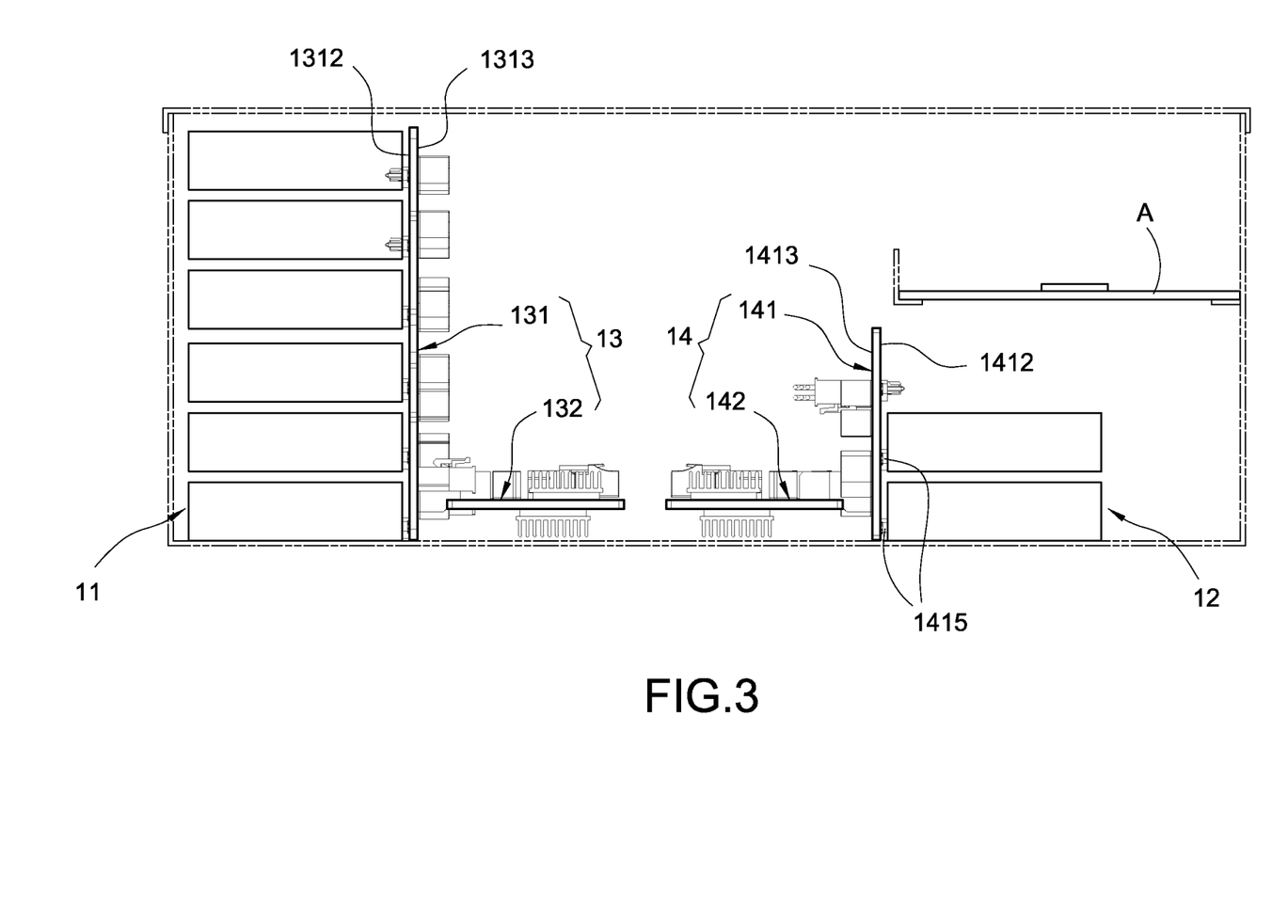
FIG. 3 is a side view of a preferred embodiment of an improved backplane structure and a server system utilizing a backplane structure of the present invention.
Figure 4:
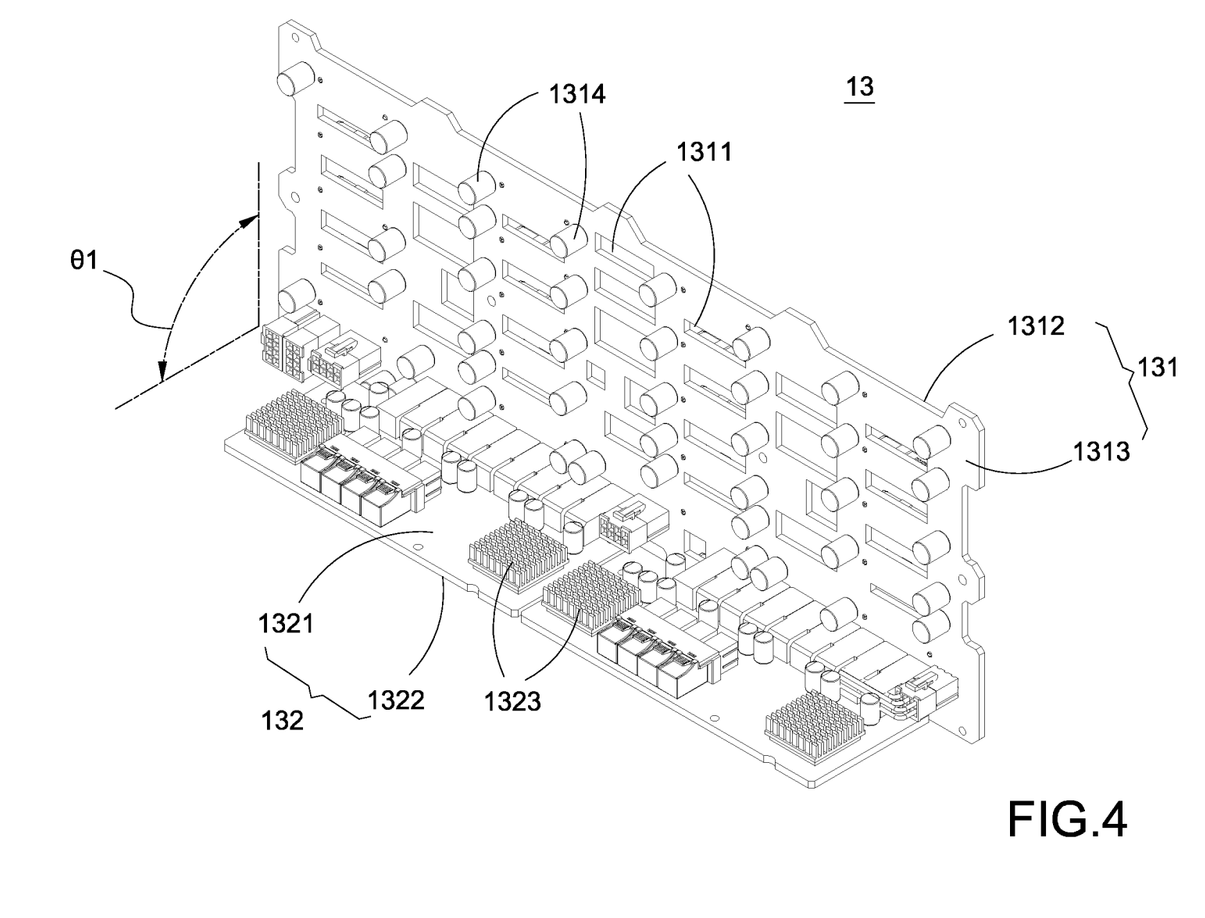
FIG. 4 is a perspective view of a first backplane according to a preferred embodiment of an improved backplane structure and a server system utilizing a backplane structure of the present invention.
Figure 5:
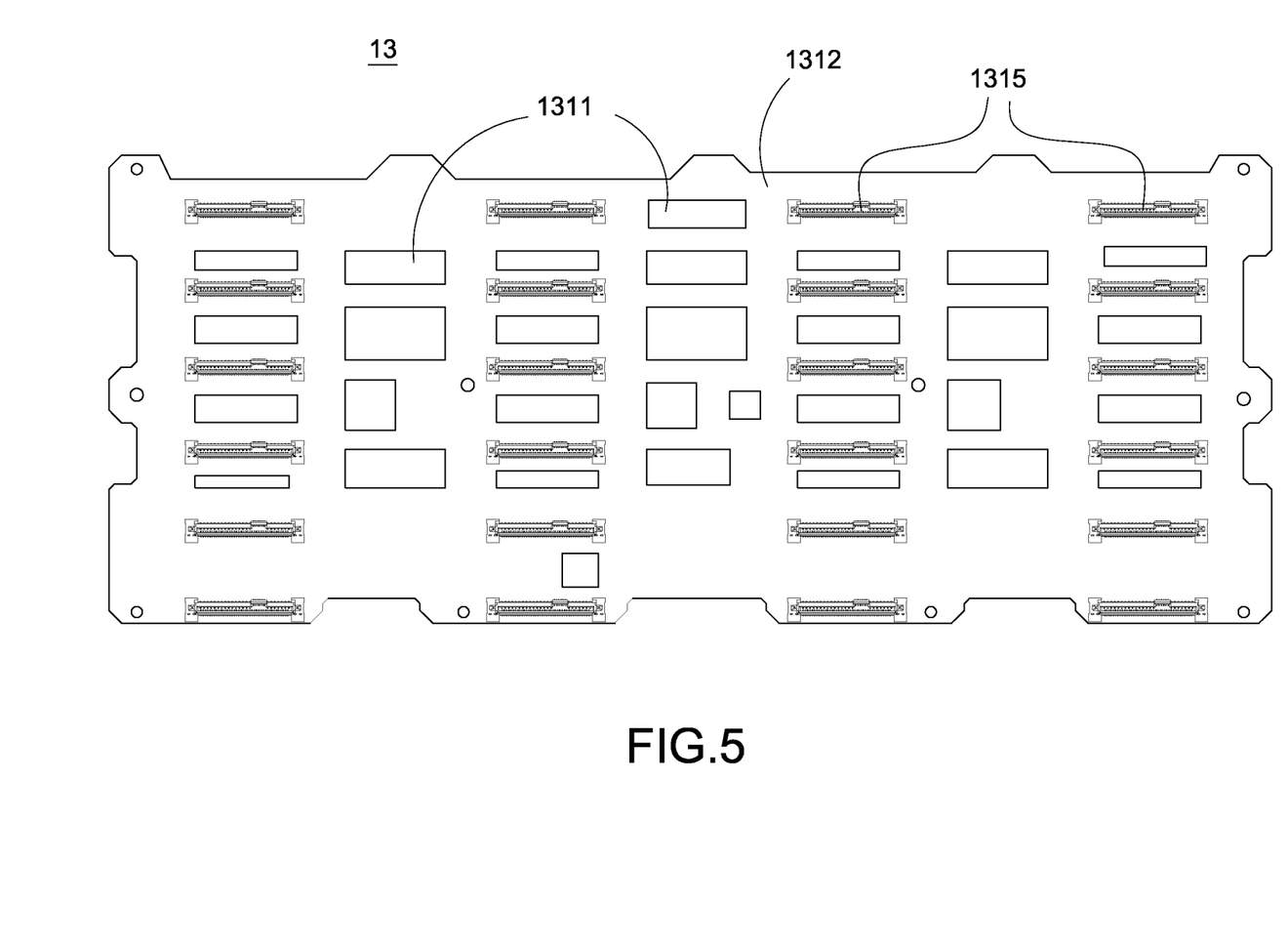
FIG. 5 is a front view of a first backplane according to a preferred embodiment of an improved backplane structure and a server system utilizing a backplane structure of the present invention.

Please refer to FIG. 2, FIG. 3, FIG. 4 and FIG. 5 in which an exploded view of a preferred embodiment of an improved backplane structure and a server system utilizing a backplane structure of the present invention, a side view of a preferred embodiment of an improved backplane structure and a server system utilizing a backplane structure of the present invention, a perspective view of a first backplane according to a preferred embodiment of an improved backplane structure and a server system utilizing a backplane structure of the present invention a front view of a first backplane according to a preferred embodiment of an improved backplane structure and a server system utilizing a backplane structure of the present invention and a perspective view of a second backplane according to a preferred embodiment of an improved backplane structure and a server system utilizing a backplane structure of the present invention are respectively shown. As shown in the figures, a backplane structure comprising: a first hard disk module 11; a second hard disk module 12; a first backplane 13 having a first wiring board 131 and a second wiring board 132. The first wiring board 131 has a first surface 1312 and a second surface 1313. Further, the first wiring board 131 include a plurality of air vents 1311 (as shown in FIG. 4) and a plurality of passive components 1314 (as shown in FIG. 4) arranged thereon. The first surface 1312 has a plurality of connectors 1315 (as shown in FIG. 5). On the other hand, the second wiring board 132 is arranged at a bottom portion of the first wiring board 231 and maintained at a first angle $\theta 1$ with the first wiring board 131. The second wiring board 132 has a third surface 1321 and a fourth surface 1332; and includes a plurality of active components 1323 (as shown in FIG. 4) arranged thereon. Further, the second surface 1313 is facing to oppose to the third surface 1321 with the first angle $\theta 1$ between the two surfaces. In this preferred embodiment, the first angle $\theta 1$ is 90 degree. The first wiring board 131 and the second wiring board 132 can be attached to each other with an insertion-type configuration, such as an electric connector.

Figure 6:
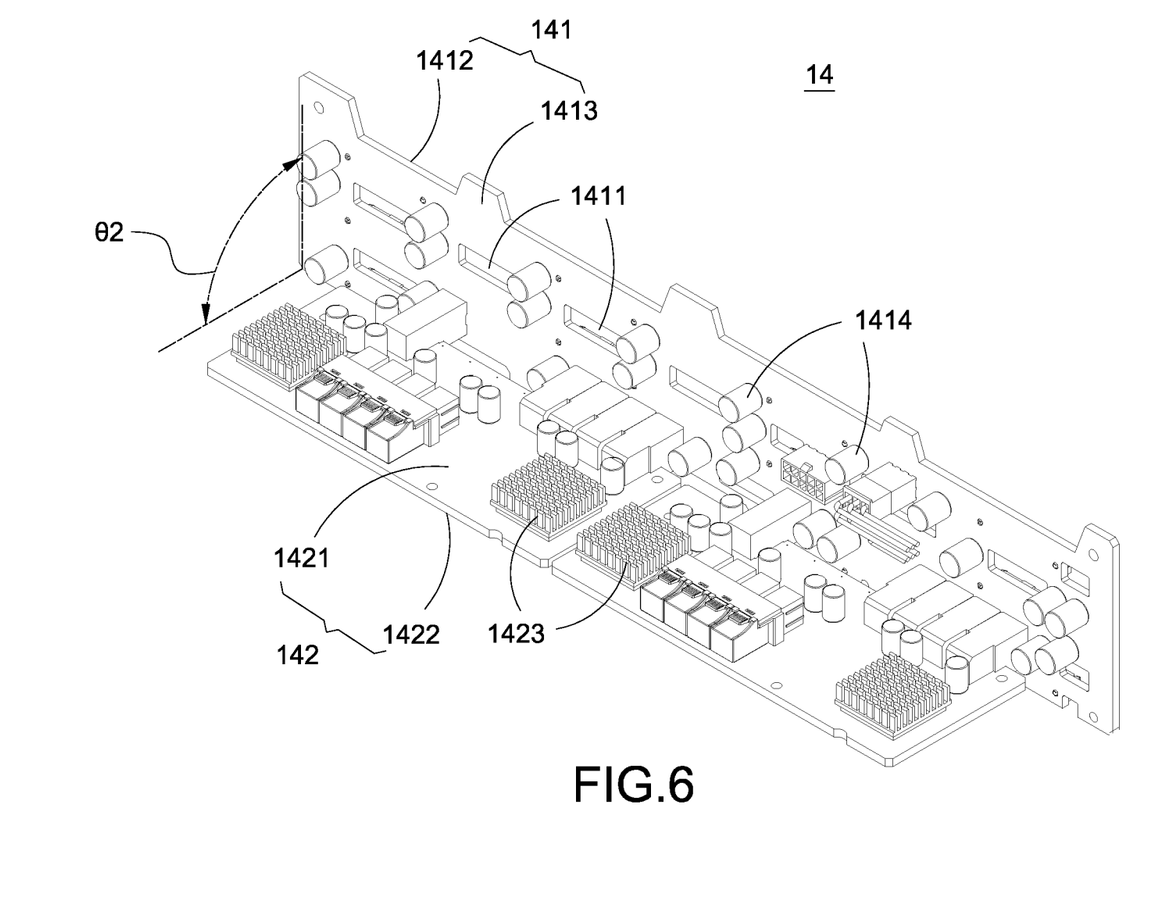
FIG. 6 is a perspective view of a second backplane according to a preferred embodiment of an improved backplane structure and a server system utilizing a backplane structure of the present invention.

Please note that, based upon the present invention, a sever system may contain two or more proposed backplane structure, as so to maximum the total performance. For example, as shown in FIG. 2, and FIG. 6, the backplane structure further comprises a second backplane 14. Same as prior description, the second backplane 14 includes a third wiring board 141 and a fourth wiring board 142. The third wiring board 141 has a fifth surface 1412 and a sixth surface 1413. Further, the third wiring board 141 includes a plurality of air vents 1411 (as shown in FIG. 6) and a plurality of passive components 1414 (as shown in FIG. 6) arranged thereon. The fifth surface 1412 contains a plurality of connectors 1415 (as shown in FIG. 5). As shown in figures, The fourth wiring board 142 can be arranged at a bottom portion of the third wiring board 141 and maintained at a second angle $\theta 2$ with the third wiring board. The fourth wiring board 142, having a seventh surface 1421 and an eighth surface 1422, contains a plurality of active components 1423 (as shown in FIG. 6) arranged thereon. The sixth surface 1413 of the third wiring board 141 is facing to oppose to the seventh surface 1421 of the fourth wiring board 142 with the second angle $\theta 2$ between the two surfaces. In this preferred embodiment, the second angle $\theta 2$ is 90 degree. Again, the third wiring board 141 and the fourth wiring board 142 can be attached to each other with an insertion-type configuration, such as an electric connector.

As shown in FIG. 2, the first backplane 13 and the second backplane 14 are between the first hard disk module 11 and the second hard disk module 12. The first surface 1312 of the first wiring board 131 of the first backplane 13 is directly corresponding to the first hard disk module 11; and the fifth surface 1412 of the third wiring board 141 of the second backplane 14 is directly corresponding to the second hard disk module 12. Furthermore, as shown in FIG. 3, in this preferred embodiment, a height of the first backplane 13 is higher than a height of the second backplane 14. The different attitude between the first backplane 13 and the second backplane 14 provides a receiving space for a motherboard A. The motherboard A is supported by an outer frame to be on top of the second hard disk module 12.

As mentioned above, the backplane structure of the present invention separates the passive electrical components and active components into two different boards which have L-shape connection to each other. In specific, the first backplane 13 includes the first wiring board 131 and the second wiring board 132 with the L-Shape connection. The first wiring board 131 can be disposed with the passive components 1314 and the second wiring board 132 can be disposed with the active components 1323. Same mechanism applied in the second backplane 14 as well. The second backplane 13 includes the third wiring board 141 and the four wiring board 142 with the L-Shape connection. The third wiring board 141 can be disposed with the passive components 1414 and the four wiring board 142 can be disposed with the active components 1423.

As known in one of ordinary skilled in the art, the passive component is one that consumes energy, but does not produce energy. Resistors, capacitors, inductors, transistors, tunnel diodes, glow tubes, metamaterials and other dissipative and energy-neutral components are considered passive. On the other hand, voltage and current sources are considered active due to the its nature of generating heat and energy. By implementing the backplane in the present invention, the high thermal energy and heat from the active component will not directly influence the passive components. As such, the heat dissipating issue is significantly being improved.

Furthermore, a plurality of air vents 1311, 1411 are provided on the first wiring board 131 and the third wiring board 141. With such design, there would be less thermal energy generated by the components at the vertical portions. And with the auxiliary heat dissipation design of the air vents, the effect of heat dissipation of the parts arranged at the bottom portions of the backplanes can be also facilitated.

In view of the above, the inventor of the present invention is able to achieve the objectives expected and to overcome the drawbacks of known arts based on great experience and creative concepts, which leads to the utility of the present application to be of novelty and inventive step to comply with the requirements of patentability.

Nevertheless, the above provides preferred embodiments of the present invention for illustrative purposes only, which shall not be treated as limitations of the preset invention; any equivalent changes and modification based on the claims of the present invention shall be deemed to be within the spirit and scope of the present invention as they are further embodiments of the present invention.

What is claimed is:

1. A backplane structure, utilized for controlling and managing a hard disk module in a server system, comprising:
   a first wiring board, having a first surface and a second surface, comprising a plurality of air vents and a plurality of passive components, wherein the first surface includes at least one connector; and
   a second wiring board, connected to a bottom portion of the first wiring board through the connector, having a third surface and a fourth surface, and comprising a plurality of active components,
   wherein the second surface is opposed to the third surface at a first angle.

2. The backplane structure according to claim 1, wherein the first angle is 90 degree.

3. The backplane structure according to claim 1, wherein the plurality of air vents are arranged in a matrix form.

4. A server system utilizing a backplane structure, comprising:
   a hard disk module; and
   a backplane comprising (1) a first wiring board, with a first surface and a second surface, comprising a plurality of air vents and a plurality of passive components, wherein the first surface includes at least one connector; and (2) a second wiring board, connected to a bottom portion of the first wiring board through the connector, having a third surface and a fourth surface, and comprising a plurality of active components, wherein the second surface is opposed to the third surface at a first angle;
   wherein the first surface of the first wiring board of the backplane is directly corresponding to the hard disk module.

5. The server system according to claim 4, wherein the first angle is 90 degree.

6. The server system according to claim 4, wherein the plurality of air vents are arranged in a matrix form.

7. A server system utilizing a backplane structure, comprising:
   a first hard disk module;
   a second hard disk module;
   a first backplane, connecting to the first hard disk module, comprising (1) a first wiring board, with a first surface and a second surface, comprising a plurality of first air vents and a first plurality of passive components, wherein the first surface includes at least one first connector; and (2) a second wiring board, connected to a bottom portion of the first wiring board through the first connector, having a third surface and a fourth surface, and comprising a plurality of first active components, wherein the second surface is opposed to the third surface at a first angle;
   a second backplane, connecting to the first hard disk module, comprising (1) a third wiring board, with a fifth surface and a sixth surface, comprising a plurality of second air vents and a second plurality of passive components, wherein the fifth surface having at least one second connector; and (2) a fourth wiring board, connected to a bottom portion of the third wiring board through the second connector, having a seventh surface and an eighth surface, and comprising a plurality of second active components, wherein the sixth surface is opposed to the seventh surface at a second angle;
   wherein the first backplane and the second backplane are disposed between the first hard disk module and the second hard disk module; the first surface of the first wiring board of the first backplane is directly corresponding to the first hard disk module; the fifth surface of the third wiring board of the second backplane is directly corresponding to the second hard disk module; and a first height of the first backplane is higher than a second height of the second backplane.

8. The server system utilizing a backplane structure according to claim 7, wherein the first angle and the second angle are 90 degree.

9. The server system utilizing a backplane structure according to claim 7, wherein the first and second air vents are arranged in a matrix form.

* * * * *